(12) United States Patent
Chang et al.

(10) Patent No.: US 9,899,538 B1
(45) Date of Patent: Feb. 20, 2018

(54) NON-VOLATILE MEMORY DEVICE AND OPERATION METHOD THEREOF

(71) Applicant: UNITED MICROELECTRONICS CORP., Hsin-Chu (TW)

(72) Inventors: Chun-Lung Chang, Yilan County (TW); Tien-Fan Ou, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/591,126

(22) Filed: May 10, 2017

(30) Foreign Application Priority Data

Apr. 10, 2017 (TW) .............................. 106111856 A

(51) Int. Cl.
| | | |
|---|---|---|
| *H01L 27/115* | (2017.01) | |
| *H01L 29/788* | (2006.01) | |
| *H01L 27/11521* | (2017.01) | |
| *H01L 29/417* | (2006.01) | |
| *G11C 16/14* | (2006.01) | |
| *G11C 16/10* | (2006.01) | |
| *G11C 16/26* | (2006.01) | |
| *G11C 16/04* | (2006.01) | |

(52) U.S. Cl.
CPC ...... *H01L 29/7884* (2013.01); *G11C 16/0408* (2013.01); *G11C 16/10* (2013.01); *G11C 16/14* (2013.01); *G11C 16/26* (2013.01); *H01L 27/11521* (2013.01); *H01L 29/41775* (2013.01); *G11C 16/0416* (2013.01); *H01L 27/115* (2013.01)

(58) Field of Classification Search
CPC ............. H01L 27/115; H01L 27/11521; G11C 16/0416
USPC ...................................................... 365/185.01
See application file for complete search history.

(56) References Cited

U.S. PATENT DOCUMENTS 6,052,311 A * 4/2000 Fu ...................... G11C 16/0416
257/E27.103

OTHER PUBLICATIONS

Tkachev, Field-induced generation of electron traps in the tunnel oxide of flash memory cells, Integrated Reliability Workshop (IIRW), 2015 IEEE International, Oct. 15. 2015.

* cited by examiner

*Primary Examiner* — Jason Lappas
(74) *Attorney, Agent, or Firm* — Winston Hsu

(57) ABSTRACT

The present invention provides a non-volatile memory device, including a source region and a drain region, a channel region, a floating gate, an enhance hot carrier (hole or electron) injection gate and an erasing gate. The floating gate is disposed on the channel region and the source region and a first dielectric layer is disposed therebetween. The enhance hot carrier injection gate is disposed on the floating gate and the substrate wherein the enhance hot carrier injection gate has an L-shape cross-section. A second dielectric layer is disposed between the enhance hot carrier injection gate and the floating gate, and a fourth dielectric layer is disposed between the enhance hot carrier injection gate and the substrate. The erasing gate is disposed on the drain region. A third dielectric layer is disposed between the erasing gate and the substrate.

20 Claims, 3 Drawing Sheets

NON-VOLATILE MEMORY DEVICE AND OPERATION METHOD THEREOF

BACKGROUND OF THE INVENTION

1. Field of the Invention

The present invention relates to a non-volatile memory device and an operation method thereof, and more particularly, to a non-volatile memory device with an enhancing hot carrier injection gate and an operation method thereof.

2. Description of the Prior Art

Semiconductor memory devices used for storing data can be divided into volatile devices and non-volatile devices. Volatile memory devices lose data stored therein when a supply voltage is interrupted, while non-volatile memory devices retain the data stored therein even if the supply voltage is interrupted. Accordingly, non-volatile memory devices are widely used when the supply voltage is not always applied or often interrupted, or when a device requires only a low voltage, such as a mobile telephone, a memory card for storing music and/or image data, and other application devices.

Cell transistors of the non-volatile memory device have a stacked gate structure. The stacked gate structure includes a gate insulating layer which is sequentially stacked on a channel region of the cell transistor, a floating gate electrode, an insulating layer between gates, and a control gate electrode. The non-volatile memory device often can be formed by a silicon layer in which a channel region is formed, an oxide layer which forms a tunneling layer, a nitride layer which is used as a charge trapping layer, an oxide layer which is used as a blocking layer, and a silicon layer which is used as a control gate electrode. This structure is referred to as a silicon-oxide-nitride-oxide-silicon (or SONOS) cell structure.

A conventional SONOS memory cell can perform forward read and reverse read to store electrons in the right side or left side of the charge trapping layer. With the shrinkage of semiconductor devices, however, the size of the charge trapping layer is reduced and the electrons stored therein are becoming fewer as well. This results in increased errors of the memory devices when programming or reading devices and thus affects the reliability of semiconductor products.

SUMMARY OF THE INVENTION

The present invention therefore provides a non-volatile memory device and an operation method thereof.

According to one embodiment of the present invention, a non-volatile memory device is provided. The non-volatile memory device includes a source region and a drain region, a channel region, a floating gate, an enhance hot carrier injection gate and an erasing gate. The source region and the drain region are disposed in a substrate and the channel region is disposed therebetween. The floating gate is disposed on the channel region and the source region and a first dielectric layer is disposed therebetween. The enhance hot carrier injection gate is disposed on the floating gate and the substrate wherein the enhance hot carrier injection gate has an L-shape cross-section. A second dielectric layer is disposed between the enhance hot carrier injection gate and the floating gate, and a fourth dielectric layer is disposed between the enhance hot carrier injection gate and the substrate. The erasing gate is disposed on the drain region. A third dielectric layer is disposed between the erasing gate and the substrate, and the second dielectric layer is disposed between the erasing gate and the enhance hot carrier injection gate.

According to another embodiment of the present invention, a non-volatile memory device is provided. The non-volatile memory device includes a source region and a drain region, a channel region, a floating gate, an enhance hot carrier injection gate and an erasing gate. The source region and the drain region are disposed in a substrate and the channel region is disposed therebetween. The floating gate is disposed on the channel region and the source region and a first dielectric layer is disposed therebetween. The enhance hot carrier injection gate is disposed only on the floating gate. A second dielectric layer is disposed between the enhance hot carrier injection gate and the floating gate. The erasing gate is disposed on the drain region. A third dielectric layer is disposed between the erasing gate and the substrate, and the second dielectric layer is disposed between the erasing gate and the enhance hot carrier injection gate.

According to another embodiment of the present invention, an operation method of a non-volatile memory device is provided. First, a above-mentioned non-volatile memory device is provided. Next, a writing positive voltage is applied to the source region and a writing negative positive voltage is applied to the enhance hot carrier injection gate.

The present invention provides a novel non-volatile memory device and an operation method thereof. By using the "band-to-band hot carrier injection theory" in combination of the enhance hot carrier injection gate, the operation method can be simplified and the integration of the device can be upgraded.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
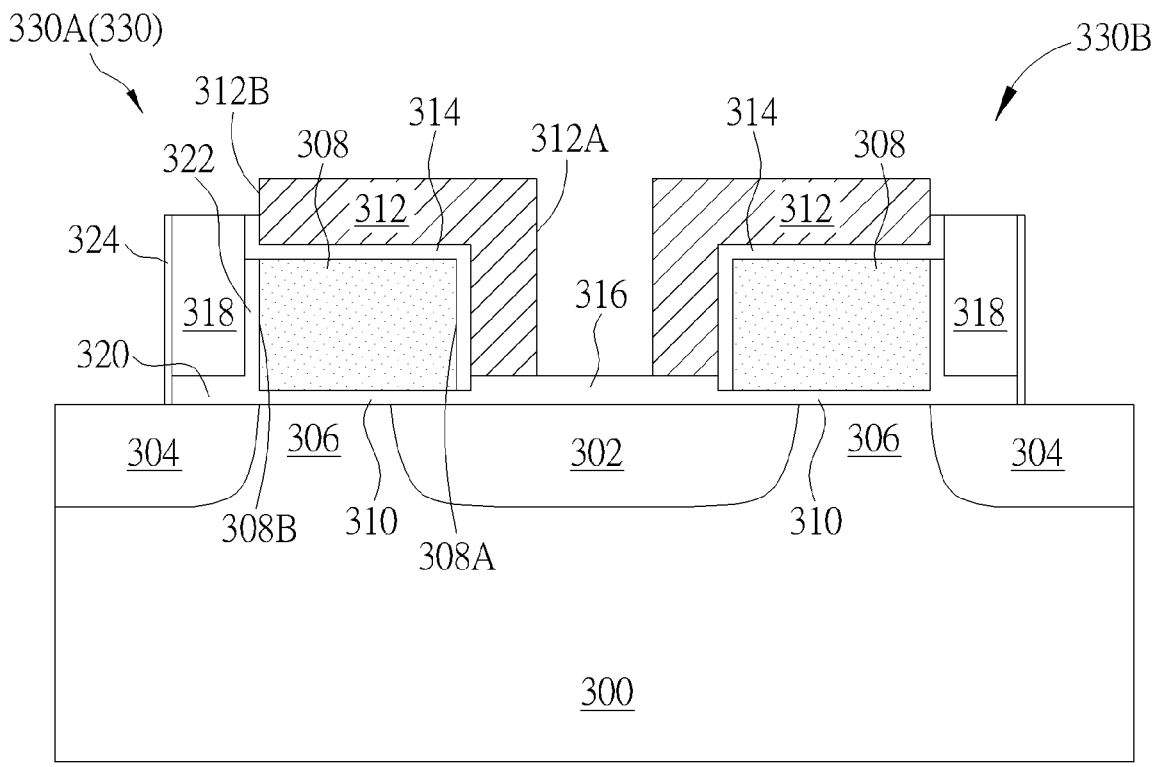
FIG. 1 illustrates a schematic diagram of the non-volatile memory device according to one embodiment of the present invention.

Please refer to FIG. 1, which illustrates a schematic diagram of the non-volatile memory device according to one embodiment of the present invention, wherein two non-volatile memory devices 330A, 330B, which are mirrorly symmetrical to each other, share one common source region 302. Since each of the non-volatile memory devices can be programmed separately, the following context will take only one device as an example. As shown in FIG. 1, the non-volatile memory device 330A of the present invention includes a substrate 300, a source region 302, a drain region 304, a channel region 306, a floating gate 308, an enhance hot carrier injection gate 312 and an erasing gate 318. The substrate 300 can be any component that can serve as a base for forming devices. In one embodiment, the substrate 300 can comprise a semiconductor material, such as a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. The source region 302 and the drain region 304 are disposed in the substrate 300, and they can have the same conductive type of dopant, for example, they can include the positive type (P-type) of conductivity dopant such as P, As, Sb, or the negative type (N-type) of conductive dopant such as B, Al, Ga. The channel region 306 is disposed in the substrate 300 between the source region 302 and the drain region 304 such that when the non-volatile memory device is operated, a current can pass through the channel region 306. Detail mechanism will be described in the following context. In one preferred embodiment, the source region 302 and the drain region 304 include the N type of dopant, the substrate 300 includes the P-type of dopant, and the hot carrier in the following context would refer to the "electrical hole".

The floating gate 308 is disposed on the channel region 306 and source region 302, that is, a part of the floating gate 308 is directly positioned above the channel region 306, while the other part of the floating gate is positioned above the source region 308. Thus, a projection of the floating gate 308 along the horizontal direction partially overlaps a projection the source regions 302. The floating gate 308 has a sidewall 308A positioned on the source region 302 and another sidewall 308B positioned on the boundary between the drain region 304 and the channel region 306, or positioned directly on the drain region 304. A first dielectric layer 310 is disposed between the floating gate 308 and the channel region 302 and the source regions 306.

The enhance hot carrier injection gate 312 is disposed on the floating gate 312. In one embodiment, the enhance hot carrier injection gate 312 further extends above the source region 302, so that the enhance hot carrier injection gate 312 contains an L-shaped or an arcuate cross-section. In one preferred embodiment, the enhance hot carrier injection gate 312, has a sidewall 312B vertically aligned with and a sidewall 308B of the floating gate 308, and has another sidewall 312B disposed on the source region 302. A second dielectric layer 314 is disposed between the enhance hot carrier injection gate 312 and the floating gate 308, and a fourth dielectric layer 316 is disposed between the source region 302 and the enhance hot carrier injection gate 312.

The erasing gate 318 is disposed on the drain region 304. A third dielectric layer 320 is disposed between the erasing gate 318 and the drain region 304, and the second dielectric layer 314 is disposed between the erasing gate 318 and the enhance hot carrier injection gate 312, and a fifth dielectric layer 322 is disposed between the erasing gate 318 and the floating gate 308. The erasing gate 318 further includes a spacer 324 on its sidewall.

As shown in FIG. 1, the thickness of the first dielectric layer 310 is smaller than the thickness of the third dielectric layer 320 and the thickness of the fourth dielectric layer 316. In one embodiment, the thickness of the first dielectric layer 310 is also smaller than the thickness of the second dielectric layer 314 and the thickness of the fifth dielectric layer 322. The thickness of the second dielectric layer 314 is substantially equal to the thickness of the fifth dielectric layer 322, and the thickness of the third dielectric layer 320 is substantially equal to the thickness of the fourth dielectric layer 316. The first dielectric layer 310, the second dielectric layer 314, the third dielectric layer 320, the fourth dielectric layer 316 and the fifth dielectric layer 322 may comprise any dielectric material, such as $SiO_2$, and in one preferred embodiment, it includes a high-k dielectric material such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafniumaluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. In one preferred embodiment, the second dielectric layer 314 comprises a multi-layered structure (not shown). The spacer contains silicon nitride (SiN) for example.

Figure 2:
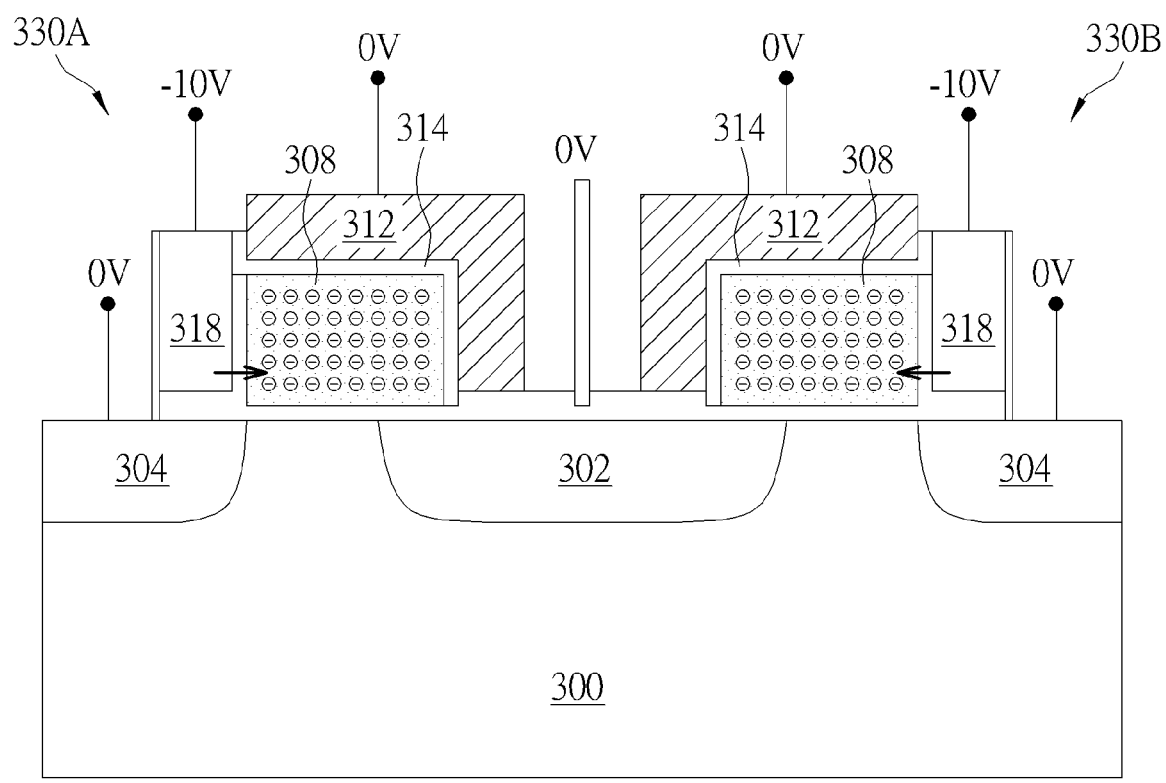
FIG. 2 shows a schematic diagram of the erasing process for the non-volatile memory device according to one embodiment of the present invention.
Figure 3:
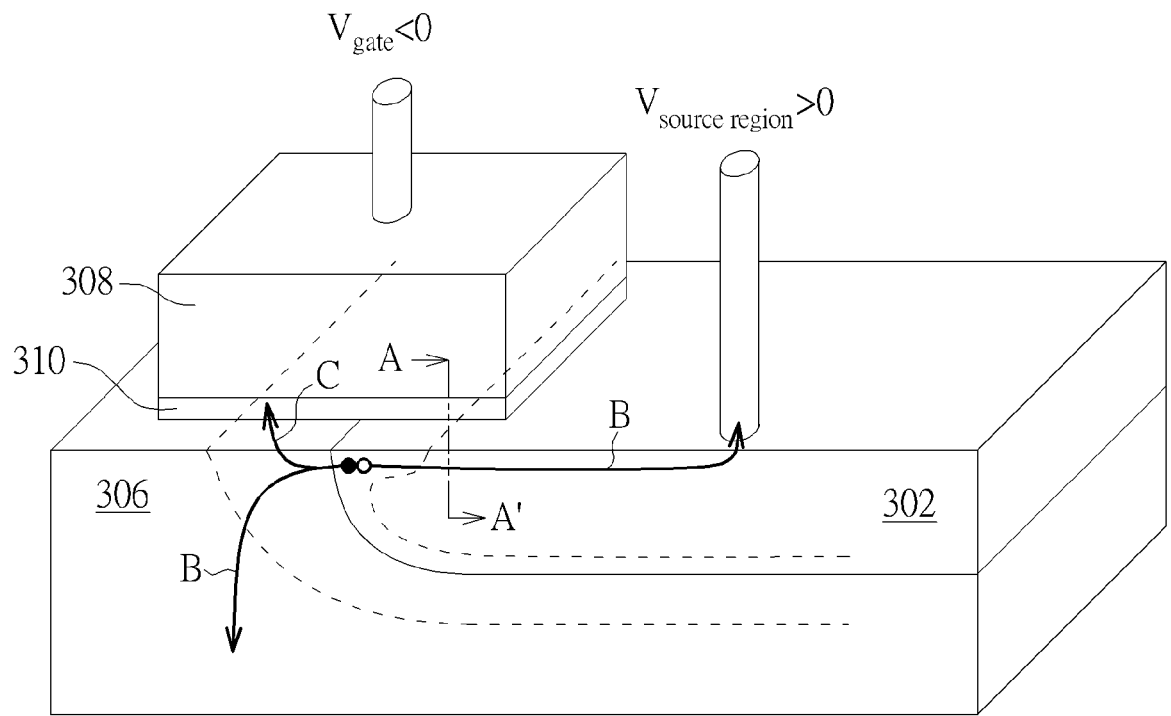
FIG. 3-5 show schematic diagrams of the writing process for the non-volatile memory device according to one embodiment of the present invention.
Figure 4:
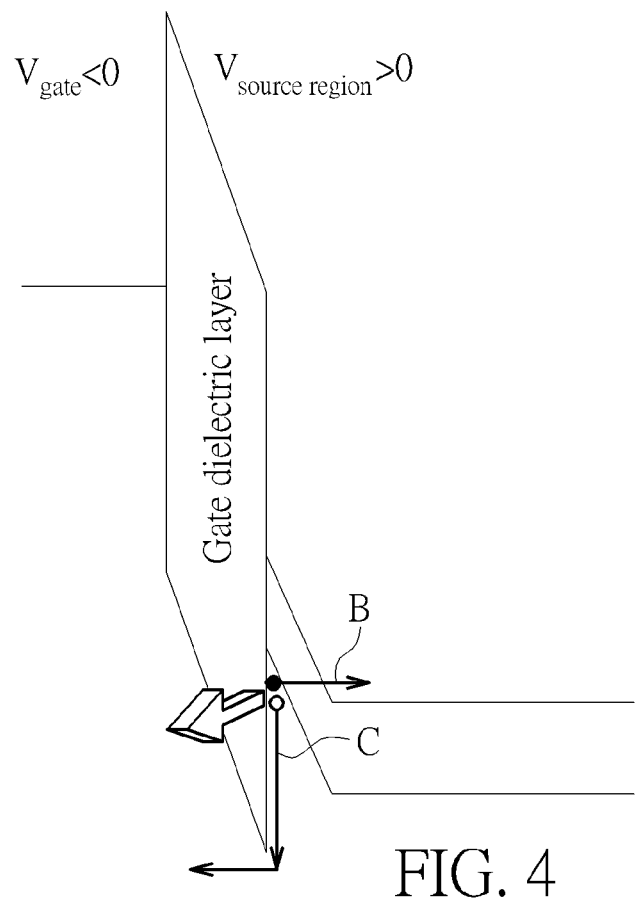
Figure 5:
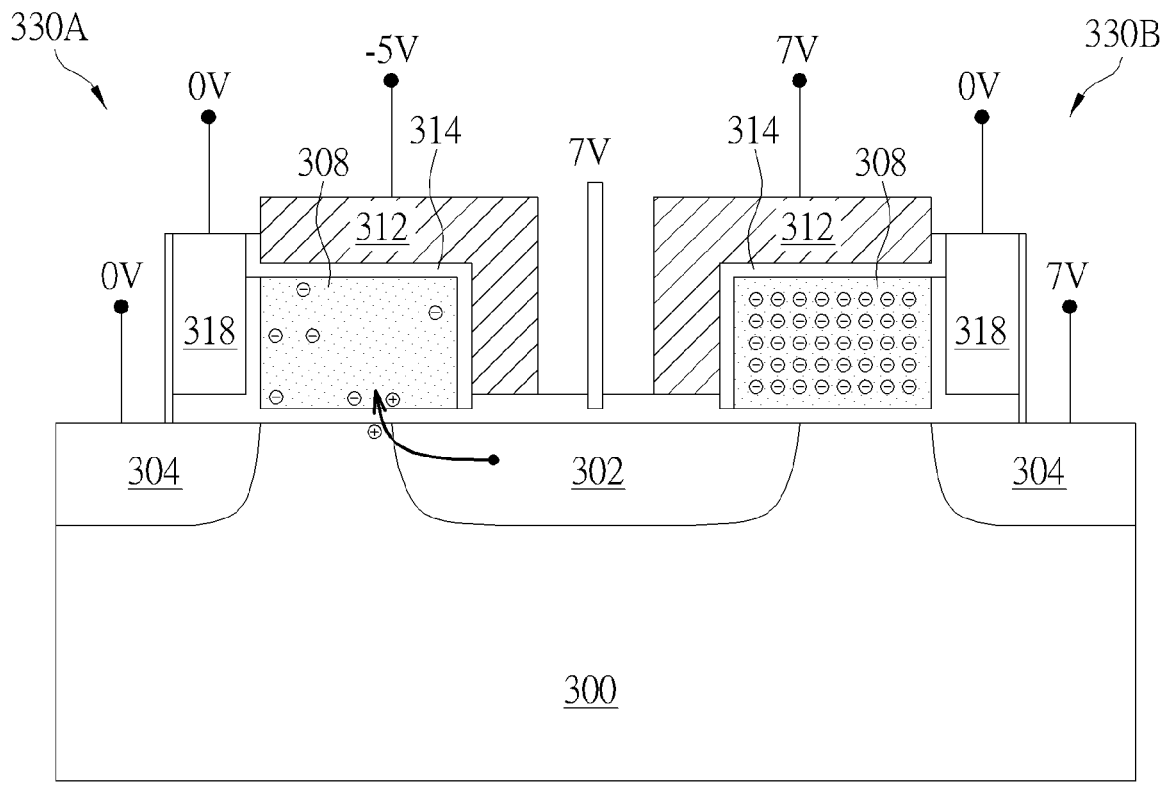

The method of programming a non-volatile type memory device according to the present embodiment includes an erasing process, a writing process, a writing inhibiting process, or a reading process. About the erasing step, please refer to FIG. 2, which shows a schematic diagram of the erasing process for the non-volatile memory device according to one embodiment of the present invention. As shown in FIG. 2, the erasing process of the present invention uses the FN tunneling (Fowler-Nordheim tunneling) theory, including applying an erasing negative voltage to the erasing electrode 314 to make the electrons injected into the floating gate 308. In one embodiment, the erasing negative voltage is −10 volts. In regarding to the writing process, please refer to FIG. 3 through FIG. 5, which shows schematic diagrams of the writing process for the non-volatile memory device according to one embodiment of the present, wherein FIG. 3 shows the basic principle of the writing process, FIG. 4 shows the energy band taken along direction AA' in FIG. 3, and FIG. 5 shows a schematic diagram of the erasing process for the non-volatile memory device according to one embodiment of the present invention. As shown in FIG. 3, the writing step in the present embodiment is performed by using "band-to-band hot carrier (hole) injection (BTBHHI)" that making the carriers (holes) injected into the floating gate 308. As shown in FIG. 3, when a negative voltage $V_{gate}$ is applied to the upper portion of the floating gate 308 and a positive voltage $V_{source}$ is applied to the source region 302, a bias of voltage along the vertical direction and the horizontal direction is formed over the AA' line. The positive voltage on the horizontal direction forces the electron to move toward the source region 302 (as depicted by arrow B in FIG. 3 and FIG. 4), or towards below the substrate 300 to forma gate induced drain leakage current (GIDL). After the movement of the electron, a carrier (electrical hole in this embodiment) will be formed and soon become a hot hole, which will be forced by the vertical bias of voltage to move across the forbidden band of the gate dielectric layer (the first dielectric layer 310) and entering the floating gate 308 (as depicted by arrow C in FIG. 3 and FIG. 4). Therefore, please refer to FIG. 5, as the enhance hot carrier injection gate 312 is disposed on the floating gate 312 and its sidewall, when a writing negative voltage is applied to a the enhancing hot carrier injection gate 312 and a writing positive voltage is applied to the source region 318, a bias along the horizontal direction and the vertical direction will be formed so the hot carrier (hot holes) can enter the floating gate 308. In another embodiment, by converting the electrical type of conductivity, the hot carrier may refer to hot electron. In one embodiment of the invention, the writing negative voltage is −5 volts, and the wiring positive voltage is 7 volts.

It is noted that the non-volatile memory device can electively perform the writing process upon one of non-volatile memory devices, that is, each one of the two non-volatile memory devices 330A, 330B can be operated individually. As shown in FIG. 5, only the nonvolatile memory device 330A at the left side performs the writing step, while the non-volatile type memory device 330B at the right side is in inhibited from the write process (not written). The writing inhibition process includes applying a first writing inhibition positive voltage to the enhance hot carrier injection gate 312 of the non-volatile memory device 300B and applying a second writing inhibition positive voltage to the drain region 304 of the non-volatile memory devices 300B. In one embodiment of the present invention, both the first writing inhibition positive voltage and the second writing inhibition positive voltage are 7 volts.

When the non-volatile type memory device performs the reading step, a first reading positive voltage is applied to the enhance hot carrier injection gate 312 and a first reading positive voltage is applied to the source region 302. In one embodiment, the first reading positive voltage is 5 volts and the second reading positive voltage is 0.5 volts. Please refer to Table 1, which shows the operation voltages of the non-volatile memory device when performing the writing process, the writing inhibiting process, the reading process and the erasing process according to one embodiment of the present invention.

TABLE 1

| | Source region | Erasing gate | Enhance hot carrier injection gate | Drain region | substrate |
|---|---|---|---|---|---|
| Erasing | 0V/ floating | Erasing negative voltage (−10V) | 0V/floating | 0V/ floating | 0V/ floating |
| Writing | Writing positive voltage (7V) | 0V/ floating | Writing negative voltage (−5V) | 0V/ floating | 0V/ floating |
| Writing inhibition | Writing inhibition positive voltage (7V) | 0V/ floating | Writing inhibition positive voltage (7V) | Writing inhibition positive voltage (7V) | 0V/ floating |
| Reading | Reading positive voltage (0.5V) | 0V/ floating | Reading positive voltage (5V) | 0V/ floating | 0V/ floating |

Figure 6:
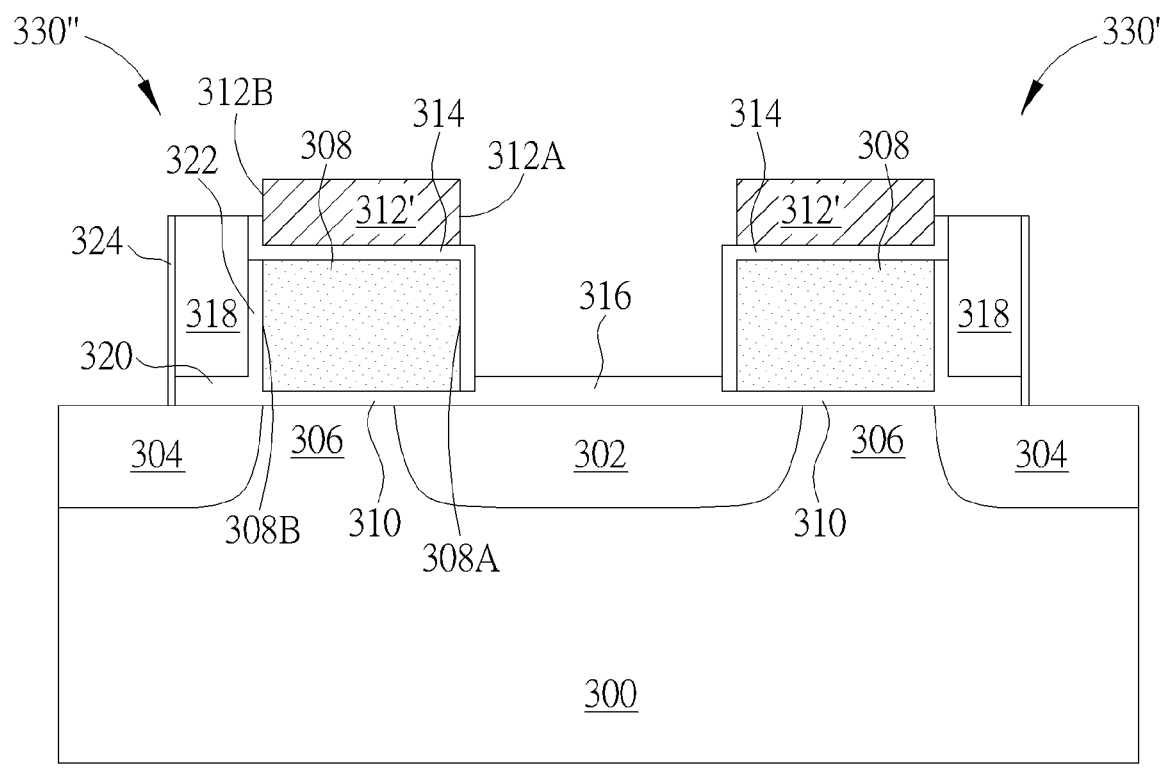
FIG. 6 shows a schematic diagram of the non-volatile memory device according to another embodiment of the present invention.

Please refer to FIG. 6, which shows a schematic diagram of the non-volatile memory device according to another embodiment of the present invention. As shown in FIG. 6, the non-volatile type memory device 330' in the present embodiment differs from previous the embodiment in that the enhance hot carrier injection gate 312 in the present embodiment is only disposed on the floating gate 308, and does not extend to the sidewall 308A of the floating gate 308. In the embodiment of FIG. 6, the sidewall 312A of the enhance hot carrier injection gate 312 is vertically aligned with the sidewall 308A of the floating gate 308, making a projection of the enhance hot carrier injection gate 312 along the horizontal direction completely overlaps a projection the floating gate 308. In another embodiment, a projection of the enhance hot carrier injection gate 312 along the horizontal direction partially overlaps a projection the floating gate 308. Please refer to Table 2, which shows the operation voltages of the non-volatile memory device when performing the writing process, the writing inhibiting process, the reading process and the erasing process according to this embodiment of the present invention.

TABLE 2

| | Source region | Erasing gate | Enhance hot carrier injection gate | Drain region | substrate |
|---|---|---|---|---|---|
| Erasing | 0V/ floating | Erasing negative voltage (−10V) | 0V/floating | 0V/ floating | 0V/ floating |
| Writing | Writing positive voltage (12V) | 0V/ floating | Writing negative voltage (−7V) | 0V/ floating | 0V/ floating |
| Writing inhibition | Writing inhibition positive voltage (12V) | 0V/ floating | Writing inhibition positive voltage (12V) | Writing inhibition positive voltage (12V) | 0V/ floating |
| Reading | Reading positive voltage (0.5V) | 0V/ floating | Reading positive voltage (5V) | 0V/ floating | 0V/ floating |

In summary, the present invention provides a novel non-volatile memory device and an operation method thereof. By using the "band-to-band hot carrier injection theory" in combination of the enhance hot carrier injection gate, the operation method can be simplified and the integration of the device can be upgraded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A non-volatile memory device, comprising:
a source region and a drain region, disposed in a substrate;
a channel region, disposed in the substrate between the source region and the drain region;
a floating gate, disposed on the channel region and the source region, wherein a first dielectric layer is disposed between the floating gate and the substrate;
an enhance hot carrier injection gate disposed on the floating gate and the source region, wherein the enhance hot carrier injection gate has an L-shaped cross-section and a second dielectric layer is disposed between the enhance hot carrier injection gate and the floating gate, and a fourth dielectric layer is disposed between the enhance hot carrier injection gate and the substrate; and
an erasing gate, disposed on the drain region, wherein a third dielectric layer is disposed between the erasing gate and the substrate, and the second dielectric layer is disposed between the erasing gate and the enhance hot carrier injection gate.

2. The non-volatile memory device according to claim 1, wherein a sidewall of the floating gate is disposed on the source region.

3. The non-volatile memory device according to claim 2, wherein another sidewall of the floating gate is vertically aligned with a boundary between the drain region and the channel region.

4. The non-volatile memory device according to claim 1, wherein a thickness of the first dielectric layer is less than a thickness of the third dielectric layer.

5. The non-volatile memory device according to claim 1, wherein a thickness of the first dielectric layer is less than a thickness of the fourth dielectric layer.

6. The non-volatile memory device according to claim 1, wherein in writing the non-volatile memory device, a writing negative voltage is applied to the enhance hot carrier injection gate and a writing positive voltage is applied to the source region.

7. The non-volatile memory device according to claim 1, wherein in erasing the non-volatile memory device, an erasing negative voltage is applied to the erasing gate.

8. A non-volatile memory device, comprising:
a source region and a drain region, disposed in a substrate;
a channel region, disposed in the substrate between the source region and the drain region;
a floating gate, disposed on the channel region and the source region, wherein a first dielectric layer is disposed between the floating gate and the substrate;
an enhance hot carrier injection gate disposed only on the floating gate, wherein a second dielectric layer is disposed between the enhance hot carrier injection gate and the floating gate; and
an erasing gate, disposed on the drain region, wherein a third dielectric layer is disposed between the erasing gate and the substrate, and the second dielectric layer is disposed between the erasing gate and the enhance hot carrier injection gate.

9. The non-volatile memory device according to claim 8, wherein a sidewall of the floating gate is disposed on the source region.

10. The non-volatile memory device according to claim 9, wherein another sidewall of the floating gate is vertically aligned with a boundary between the drain region and the channel region.

11. The non-volatile memory device according to claim 8, wherein a thickness of the first dielectric layer is less than a thickness of the third dielectric layer.

12. The non-volatile memory device according to claim 8, wherein the enhance hot carrier injection gate completely coincides with the floating gate along a horizontal direction.

13. The non-volatile memory device according to claim 8, wherein the enhance hot carrier injection gate partially overlaps with the floating gate along a horizontal direction.

14. The non-volatile memory device according to claim 8, wherein in writing the non-volatile memory device, a writing negative voltage is applied to the enhance hot carrier injection gate and a writing positive voltage is applied to the source region.

15. The non-volatile memory device according to claim 8, wherein in erasing the non-volatile memory device, an erasing negative voltage is applied to the erasing gate.

16. A method of operating a non-volatile memory device, comprising:
providing a non-volatile memory device according to claim 1; and
performing a writing process, comprising applying a writing negative voltage to the enhance hot carrier injection gate and applying a writing positive voltage to the source region.

17. The method of operating a non-volatile memory device according to claim 16, further comprising:
performing an erasing process, comprising applying an erasing negative voltage to the erasing gate.

18. The method of operating a non-volatile memory device according to claim 16, further comprising:
performing a reading process, comprising applying a first reading positive voltage to the source region and applying a second reading positive voltage to the enhance hot carrier injection gate.

19. The method of operating a non-volatile memory device according to claim 16, further comprising:
providing a second non-volatile memory device, comprising:
a second drain region, disposed in the substrate;
a second channel region, disposed in the substrate between the source region and the second drain region;
a second floating gate, disposed on the second channel region and the source region, wherein a sixth dielectric layer is disposed between the second floating gate and the substrate;
an second enhance hot carrier injection gate disposed on the second floating gate and the source region, wherein the second enhance hot carrier injection gate has an L-shaped cross-section and a seventh dielectric layer is disposed between the second enhance hot carrier injection gate and the second floating gate, and an eighth dielectric layer is disposed between the second enhance hot carrier injection gate and the substrate; and
an second erasing gate, disposed on the second drain region, wherein a ninth dielectric layer is disposed between the second erasing gate and the substrate, and the seventh dielectric layer is disposed between the second erasing gate and the second enhance hot carrier injection gate,
wherein the non-volatile memory device and the second non-volatile memory device share the source region, and when the non-volatile memory device proceeds the writing process, the second non-volatile memory device proceeds a writing inhibition process.

20. The method of operating a non-volatile memory device according to claim 19, wherein the writing inhibition process comprises applying a first writing inhibition positive voltage to the second enhance hot carrier injection gate applying a second inhibition positive voltage to the second drain region.

* * * * *